(12) United States Patent
Hwang

(10) Patent No.: US 9,610,655 B2
(45) Date of Patent: Apr. 4, 2017

(54) SOLDER PASTE

(71) Applicant: LG INNOTEK CO., LTD., Seoul (KR)

(72) Inventor: Deok Ki Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 189 days.

(21) Appl. No.: 14/272,127

(22) Filed: May 7, 2014

(65) Prior Publication Data
US 2014/0332116 A1 Nov. 13, 2014

(30) Foreign Application Priority Data

May 10, 2013 (KR) ........................ 10-2013-0053047

(51) Int. Cl.
*B23K 35/02* (2006.01)
*B22F 1/02* (2006.01)
*B23K 35/26* (2006.01)
*B23K 35/30* (2006.01)
*B23K 35/36* (2006.01)
(Continued)

(52) U.S. Cl.
CPC .......... *B23K 35/025* (2013.01); *B22F 1/0003* (2013.01); *B22F 1/025* (2013.01); *B23K 1/0016* (2013.01); *B23K 35/0244* (2013.01); *B23K 35/24* (2013.01); *B23K 35/262* (2013.01); *B23K 35/302* (2013.01); *B23K 35/36* (2013.01); *B23K 35/3612* (2013.01); *H01L 24/14* (2013.01); *H01L 24/27* (2013.01); *H01L 24/29* (2013.01); *H05K 3/3463* (2013.01); *B22F 2998/10* (2013.01); *C22C 1/0425* (2013.01); *C22C 1/0483* (2013.01); *H01L 24/32* (2013.01); *H01L 2224/27442* (2013.01); *H01L 2224/27849* (2013.01); *H01L 2224/29294* (2013.01); *H01L 2224/29311* (2013.01); *H01L 2224/29347* (2013.01); *H01L 2224/29439* (2013.01); *H01L 2224/32058* (2013.01); *H01L 2224/32245* (2013.01); *H01L 2224/83801* (2013.01); *H01L 2924/01322* (2013.01); *H05K 3/3484* (2013.01); *H05K 2201/0272* (2013.01)

(58) Field of Classification Search
CPC combination set(s) only.
See application file for complete search history.

(56) References Cited

U.S. PATENT DOCUMENTS

| 2011/0180311 A1 | 7/2011 | Tsuda et al. |
| 2013/0042946 A1* | 2/2013 | Yang .................... B23K 35/262 148/24 |
| 2013/0087605 A1 | 4/2013 | Kubota et al. |

FOREIGN PATENT DOCUMENTS

| CN | 101087673 A | 12/2007 |
| CN | 101208173 A | 6/2008 |

(Continued)

OTHER PUBLICATIONS

European Search Report issued in Application No. 14167751.8 dated Feb. 3, 2015.

*Primary Examiner* — Lois Zheng
(74) *Attorney, Agent, or Firm* — KED & Associates, LLP

(57) ABSTRACT

A solder paste includes a flux and powder mixed with the flux, where the powder includes first powder and second powder mixed with each other. The first powder may be a tin (Sn) and at least one metal dissolved in the tin (Sn), and the second powder may be a copper (Cu) powder, the surface of which is coated with silver (Ag).

20 Claims, 14 Drawing Sheets

(51) Int. Cl.
*B23K 35/24* (2006.01)
*B23K 1/00* (2006.01)
*H05K 3/34* (2006.01)
*H01L 23/00* (2006.01)
*B22F 1/00* (2006.01)
*B23K 35/00* (2006.01)
*C22C 1/04* (2006.01)

(56) References Cited

FOREIGN PATENT DOCUMENTS

| | | | |
|---|---|---|---|
| CN | 101479073 A | 7/2009 | |
| CN | 102107340 A | 6/2011 | |
| JP | 2004-114123 A | 4/2004 | |
| JP | 2006-102769 * | 4/2006 | ............ B23K 35/14 |
| JP | 2006-102769 A | 4/2006 | |
| KR | 10-2003-0070075 A | 8/2003 | |
| KR | 10-2009-0007770 A | 1/2009 | |
| KR | 10-2009-0046954 | 5/2009 | |

* cited by examiner

SOLDER PASTE

CROSS REFERENCE TO RELATED APPLICATION

This application claims priority under 35 U.S.C. §119 to Korean Patent Application No. 10-2013-0053047, filed on May 10, 2013 in Korea, which is hereby incorporated in its entirety by reference.

BACKGROUND

1. Field

Embodiments relate to a solder paste as an admixture of solder powder and a flux for soldering.

2. Background

Reflow soldering is used for internal bonding of electronic components in consideration of fine bonding parts. A solder paste used in reflow soldering is an admixture of solder powder and a flux for soldering.

To prevent environmental pollution, lead-free solder (referred to as "Pb-free solder") has widely been used in internal bonding of electronic components. Pb-free solder refers to solder powder that does not include Pb and combines two or more elements of Sn, Ag, Sb, Cu, Zn, Bi, Ni, Cr, Fe, P, Ge, Ga, and the like with each other.

In addition, Sn—Ag based alloys in which Sn, Ag, and Cu are mixed with one another has widely been used as Pb-free solder. Since soldering temperature is within a range of about 240° C.~250° C. when using Sn—Ag based alloys, Pb-free solder requires a high solidus temperature of at least 250° C.

BRIEF DESCRIPTION OF THE DRAWINGS

The embodiments will be described in detail with reference to the following drawings in which like reference numerals refer to like elements wherein.

DESCRIPTION OF SPECIFIC EMBODIMENTS

Figure 1:
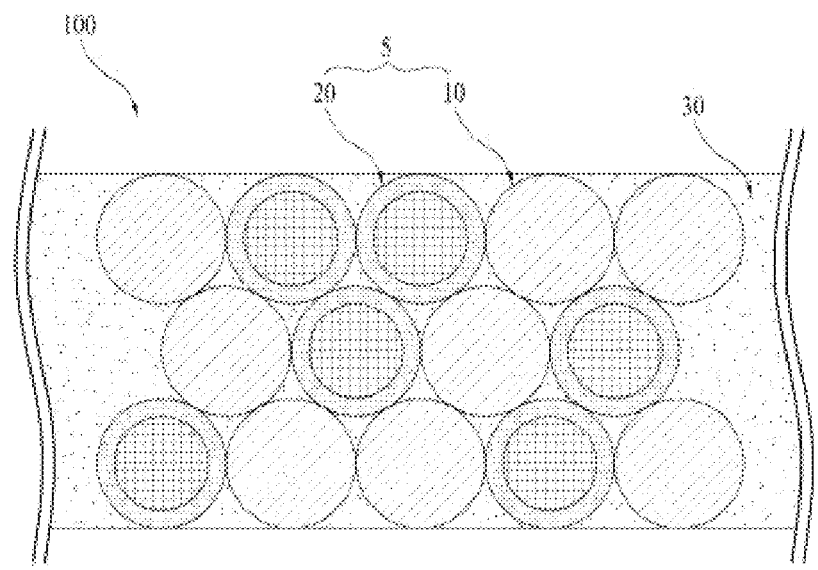
FIG. 1 shows a general view of a solder paste according to an embodiment.

Hereinafter, embodiments will be clearly revealed via the following description with reference to the annexed drawings. In the description of the embodiment, it will be understood that when each layer (film), region, pattern, or structure is referred to as being 'on' or "under" another layer (film), region, pad, or pattern, the layer (film), region, pattern, or structure can be directly on/under the layer (film), region, pad, or pattern, and one or more intervening elements may also be present. When an element is referred to as being 'on' or 'under', 'under the element' as well as 'on the element' can be included based on the element. In addition, it will also be understood that "on/above" or "under/below" each layer may be described relative to the drawings.

In the drawings, the size may be exaggerated, omitted, or schematically illustrated for clarity and convenience. In addition, the size of each constituent element does not wholly reflect an actual size thereof. In addition, the same reference numerals indicate the same or like components throughout the description of the drawings. Hereinafter, a solder paste according to an embodiment will be described with reference to the accompanying drawings.

Figure 2:
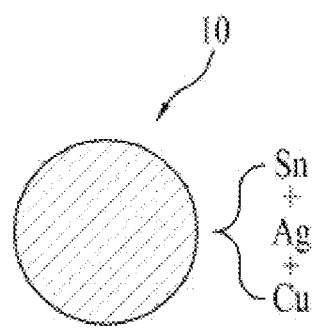
FIG. 2 shows an enlarged view of first powder shown in FIG. 1.
Figure 3:
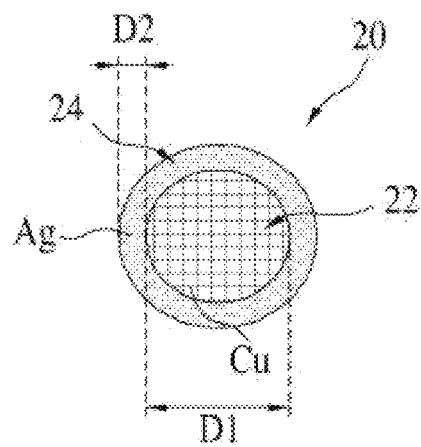
FIG. 3 shows an enlarged view of second powder shown in FIG. 1.

FIG. 1 shows a general view of a solder paste 100 according to an embodiment, FIG. 2 shows an enlarged view of first powder 10 shown in FIG. 1, and FIG. 3 shows an enlarged view of second powder 20 shown in FIG. 1.

Referring to FIGS. 1 to 3, the solder paste 100 may include mixed powder 5 and a flux 30, and may take the form of an admixture of the mixed powder 5 and the flux 30. The mixed powder 5 may be solder powder, and may be a mixture of the first powder 10 and the second powder 20.

The flux 30 serves to prevent oxidation at the surface of a base metal (for example, a substrate, see 105 in FIGS. 12A and 12B) or a component that will come into contact with the base metal (see 210 in FIGS. 12A and 12B) during reflow soldering, thereby enhancing adhesion between the base metal and the component during soldering.

The flux 30 may be liquid-phase, a solid having ductility, or a solid. The flux 30 may include rosin, a thinner, an activator, and the like. The thinner has volatility and thus is evaporated. The rosin and the activator remain as solid residues. The rosin may be used as a subacid activator, and may be added to prevent oxidation of a metal. The rosin may be one or more materials selected from among disproportionated rosin, hydrogenated rosin, dehydrogenated rosin, and non-modified rosin. The activator may serve to decompose or remove an oxide film that may be present on a portion of a substrate to be soldered (for example, oxidized copper or an oxide of solder on a PCB substrate).

The flux 50 may further selectively include a halogenated compound that discharges hydrogenhalides when being heated. For example, the halogenated compound may be selected from the group consisting of trans-2,3-dibromo-2-buten-1,4-diol, meso-2,3-dibromosuccinate, tris-(2,3-dibromopropyl) isocyanurate, and combinations thereof.

The flux 30 may be formed by distributing the activator, gelant, resin, and the like in a solvent. Here, the used term "resin" may include a natural resin, such as rosin, chemically modified rosin, and a synthetic resin. The rosin may be a natural material acquired from a natural source, such as pine sap, and may contain an isomer of an abietic acid.

The flux 30 may include the activator present in an amount of 30%~70% based on the total weight of a composition, more particularly in an amount of 40%~60%. In addition, the flux 30 may include the gelant present in an amount of 0.1%~10% based on the total weight of a composition, more particularly in an amount of 0.4%~1%. The rheology of the flux 30 may depend on the level of the gelant present in the flux 30, and the flux 30 may have Newtonian rheology.

The first powder 10 may include tin (Sn) as a main component and may be an alloy of Sn and a metal dissolved in Sn. In this case, the metal dissolved in Sn may include at least one of silver (Ag), copper (Cu), antimony (Sb), bismuth (Bi), indium (In), and zinc (Zn).

The first powder 10 may be composed of tin (Sn), silver (Ag), and copper (Cu), and may be acquired by converting an alloy lump of Sn, Ag, and Cu into a powder form. For example, the ratio of weight percentage of Sn to Ag to Cu in the first powder 10 may be 96.5:3:0.5, without being limited thereto.

The second powder 20 may be powder in which Ag is coated on the surface of a metal dissolved in Sn. For example, the second powder 20 may be Cu powder, the surface of which is coated with Ag. Ag may be coated on the entire surface the Cu powder 22 or the entire circumferential surface of the Cu powder 22.

The second powder 20 may be acquired by forming a Ag coating film 24 on the surface of the Cu powder 22. For example, the Ag coating film 24 may be formed using plating, precipitation in an aqueous solution, or the like.

During reflow soldering, the Ag coating film 24 may serve as a barrier to prevent diffusion of Sn to the surface of the Cu powder 22.

A reflow soldering process may be implemented as follows. After the solder paste 10 is applied to a location to be soldered, the applied solder paste 100 is heated to a temperature of 240° C.~250° C.

Since the melting point of Sn is lower than the melting point of Ag and the melting point of Cu, Sn included in the first powder 10 may be molten, and the molten Sn may form an intermetallic compound via reaction with Ag and Cu included in the first powder 10.

For example, the molten Sn may form $Ag_3Sn$ via reaction with Ag included in the first powder 10, and the molten Sn may form $Cu_3Sn$, $Cu_6Sn_5$, or the like via reaction with Cu included in the first powder 10.

However, the molten Sn may not immediately react with the Cu powder 22 of the second powder 20. That is, the molten Sn may not directly react with the Cu powder 22 due to the Ag coating film 24, and may form an intermetallic compound (for example, $Ag_3Sn$) via reaction with the Ag coating film 24. Reaction of the molten Sn and the Cu 22 occurs only after the Ag coating film 24 is removed via the above-described reaction so that Cu 22 is exposed from the Ag coating film 24, thus forming an intermetallic compound.

As described above, the Ag coating film 24 may serve to restrict or delay reaction between the molten Sn of the first powder 10 and the Cu 22 of the second powder 20.

Figure 4:
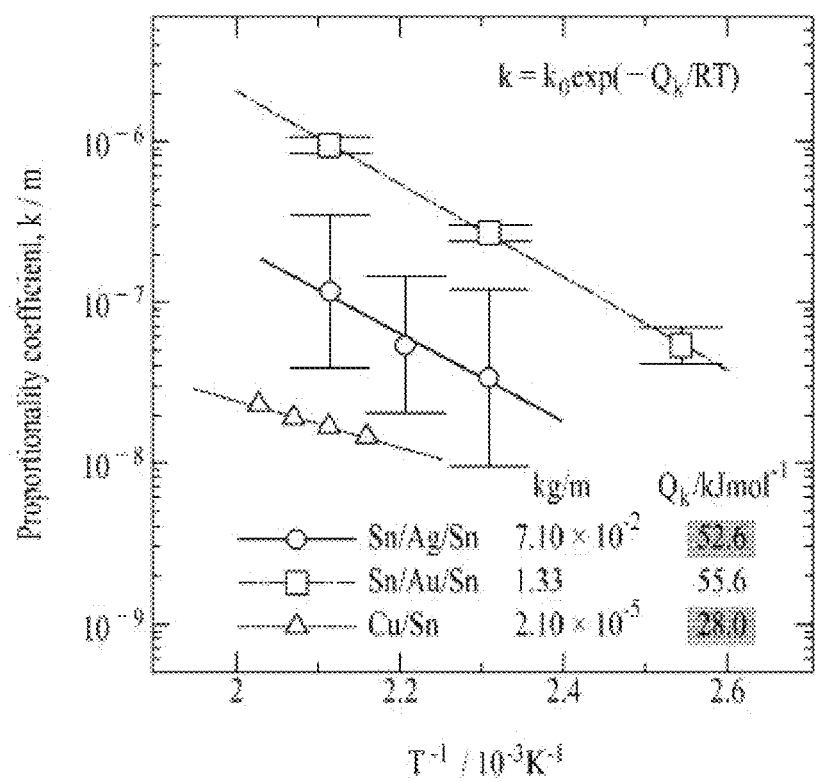
FIG. 4 shows activation energy upon reaction of copper and tin and activation energy upon reaction of silver and tin.

FIG. 4 shows activation energy upon reaction of Cu and Sn and activation energy upon reaction of Ag and Sn. It will be appreciated that first activation energy upon reaction of Cu and Sn is 28 kJ/mol and second activation energy upon reaction of Ag and Sn is 52.6 kJ/mol. That is, since the second activation energy is about two times the first activation energy, diffusion of Ag into Sn or reaction of Ag with Sn may progress slower than diffusion of Cu into Sn or reaction of Cu with Sn.

Accordingly, in the embodiment, the Ag coating film 24 formed on the surface of the Cu powder 22 restricts diffusion of Sn to the Cu powder 22 during reflow soldering, which may provide a location to be Sn soldered with sufficient wetting time, resulting in enhanced wettability.

In addition, owing to such slow reaction of the molten Sn and the Cu powder 22, sufficient time to remove voids between the first powder 10 and the second powder 20 may be achieved by reaction mass. Accordingly, the embodiment may restrict void generation in a solder layer that is generated after soldering.

Figure 5:
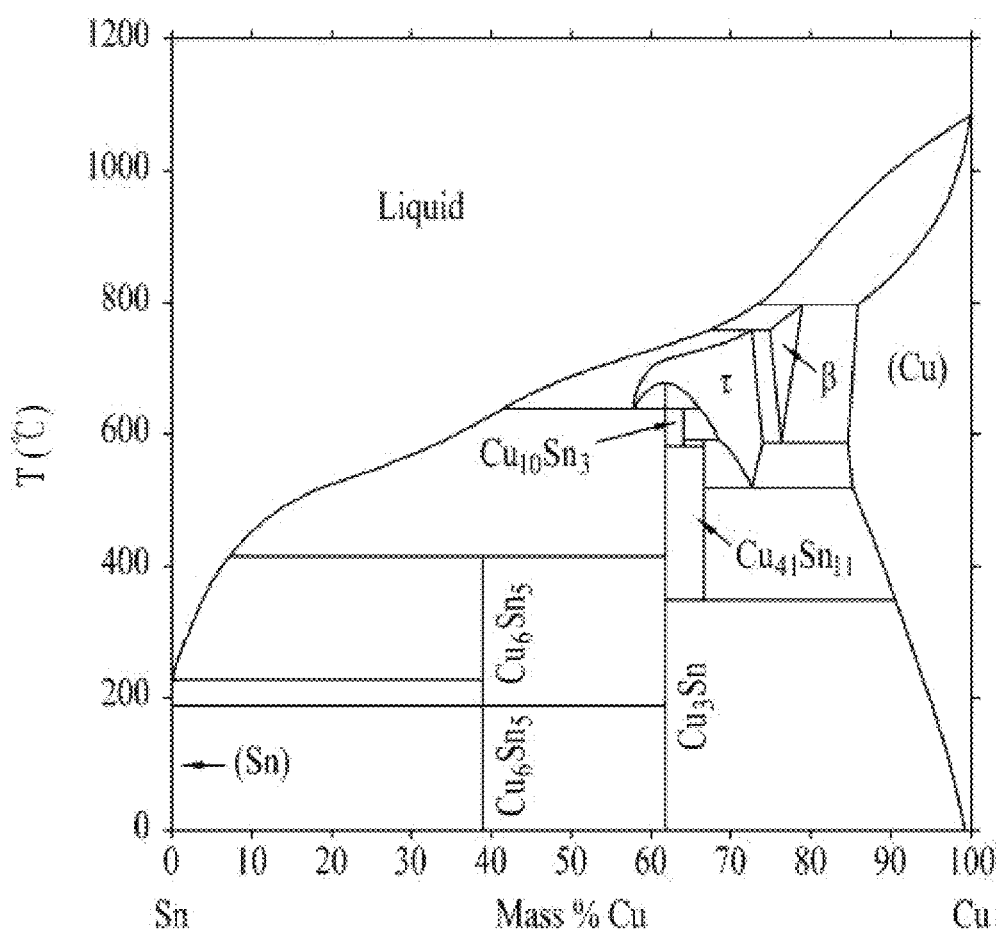
FIG. 5 shows a first phase diagram for tin of first powder and copper of second powder.
Figure 6:
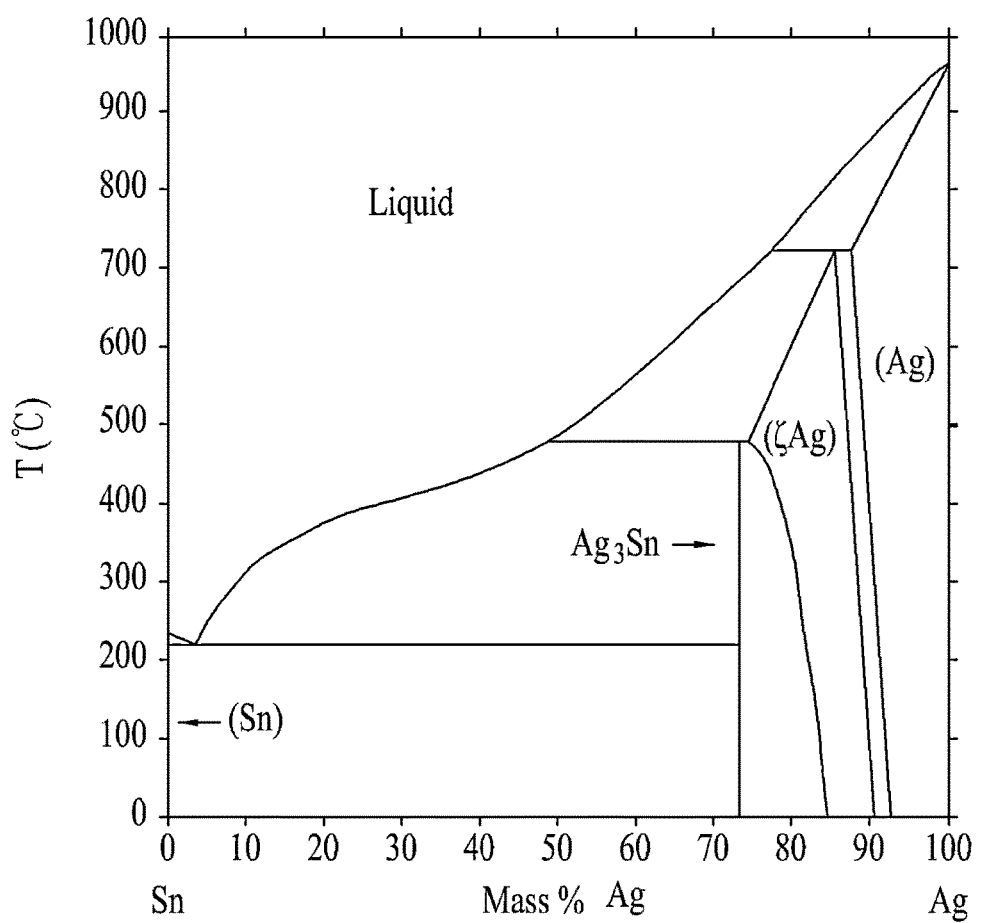
FIG. 6 shows a second phase diagram for tin of first powder and silver of second powder.

FIG. 5 shows a first phase diagram for the Sn of the first powder 10 and the Cu 22 of the second powder 20, and FIG. 6 shows a second phase diagram for the Sn of the first powder and the Ag 24 of the second powder 20. It will be appreciated that in the temperature of 200° C.~300° C. a gradient of a liquid-phase line of Ag represented in the second phase diagram more gently increases than a gradient of a liquid-phase line of Cu represented in the first phase diagram as the weight percentage (%) is increased.

Referring to the first phase diagram and the second phase diagram as exemplarily shown in FIGS. 5 and 6, in the embodiment, a diameter D1 of the Cu powder 22 and a thickness D2 of the Ag coating film 24 may be adjusted to enhance wettability and to restrict void generation in a solder layer.

The weight of the second powder 20 may be in a range of 5%~40% of the total weight of the mixed powder 5. When the weight of the second powder 20 is below 5%, remelting prevention may not be achieved. When the weight of the second powder 20 exceeds 40%, the reaction amount of the second powder 20 with the first powder 10 is excessively increased, which may make it difficult to achieve sufficient wettability, thus generating numerous voids in the solder layer.

The weight of the Ag coating film 24 may be in a range of 10%~50% of the weight of the Cu powder 22. When the weight of the Ag coating film 24 is below 10%, a temperature at which oxidation of the second powder 20 begins (hereinafter referred to as "oxidation initiation temperature") may be lower than the eutectic point of the first powder 10 (for example, about 213° C.). When the weight of the Ag coating film 24 exceeds 50%, the price of the solder paste 100 is increased and is thus economically ineffective.

The diameter D1 of the Cu powder 22 may be in a range of 2 μm~25 μm, more particularly in a range of 4 μm~7 μm. When the diameter D1 of the Cu powder 22 is below 2 μm, a great specific surface area may cause excessively fast progression of reaction with Sn of the first powder 10, resulting in poor wettability. On the other hand, when the diameter D1 of the Cu powder 22 exceeds 25 μm, slow reaction with the molten Sn may increase the quantity of added Cu, thus deteriorating the strength of the solder layer. In addition, deterioration in the strength of the solder layer may cause remelting of the solder layer in the following process.

The thickness D2 of the Ag coating film 24 may be 1 μm or less, without being limited thereto. Although the thickness D2 of the Ag coating film 24 may exceed 1 μm in another embodiment, an excessively thick thickness D2 of the Ag coating film 24 may increase the price of the solder paste 100. Since numerous voids are generated in the solder layer when the oxidation initiation temperature of the second powder 20 is lower than the eutectic point of the first powder 10, the weight of the second powder 20, the diameter D1 of the Cu powder 22, and the thickness D2 of the Ag coating film 24 must be determined such that the oxidation initiation temperature of the second powder 20 is higher than the eutectic point of the first powder 10.

Figure 7A:
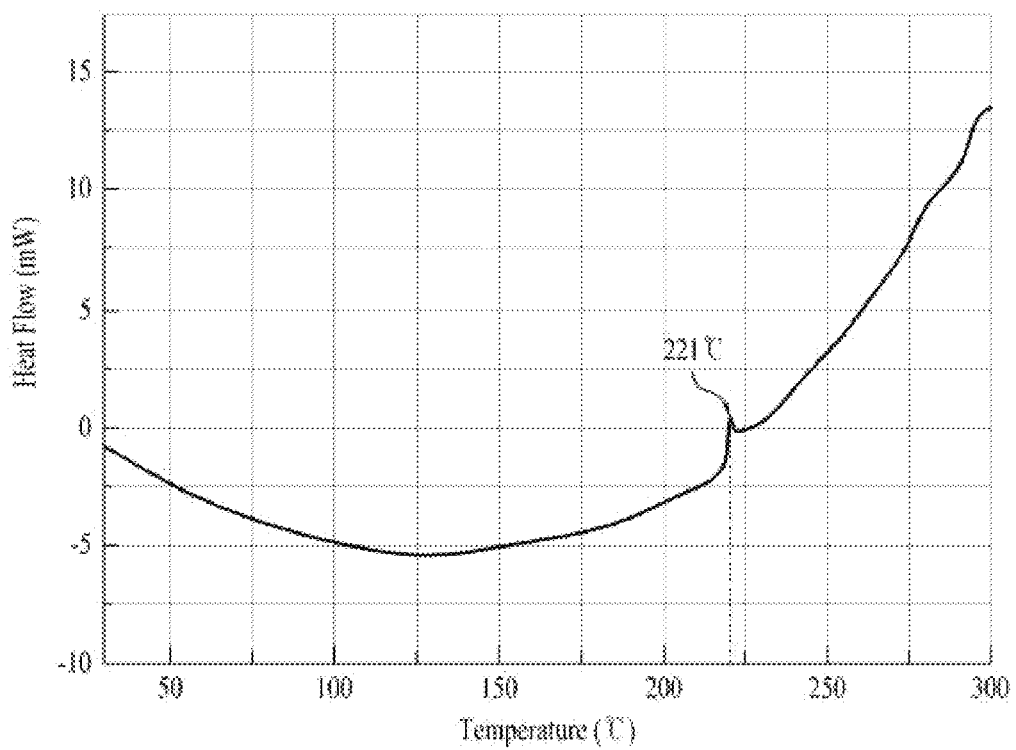
FIG. 7A shows variation of heat flow depending on the temperature of second powder according to a first embodiment.
Figure 7B:
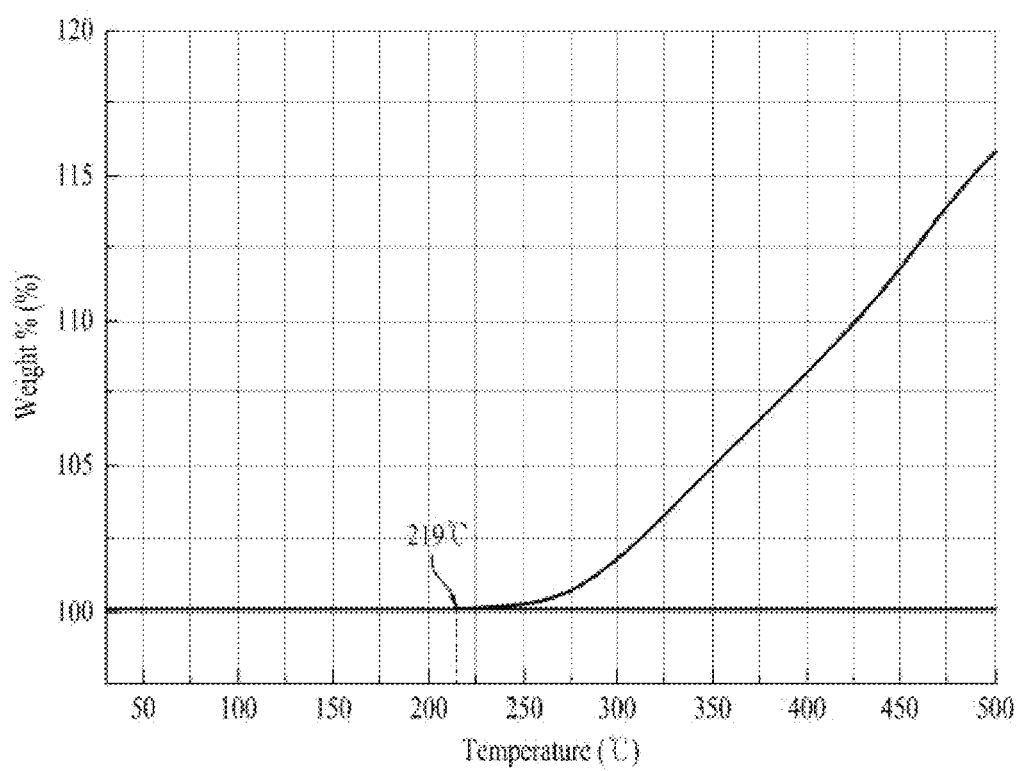
FIG. 7B shows variation of weight depending on the temperature of second powder shown in FIG. 7A.

FIG. 7A shows variation of heat flow depending on the temperature of the second powder 20 according to a first embodiment, and FIG. 7B shows variation of weight depending on the temperature of the second powder 20 shown in FIG. 7A. FIGS. 7A and 7B show a case in which the diameter D1 of the Cu powder 22 is 4 μm, the weight of the second powder 20 is 10% of the weight of the mixed powder 5, and the thickness D2 of the Ag coating film 24 is 0.1 μm.

Referring to FIG. 7A, the oxidation initiation temperature of the second powder 20 may be estimated as about 221° C. in consideration of the heat flow of the second powder 20 being rapidly increased from about 221° C. Referring to FIG. 7B, the oxidation initiation temperature of the second powder 20 may be estimated as about 219° C. in consideration of the weight of the second powder 20 beginning to increase from about 219° C.

In consideration of the results of FIGS. 7A and 7B, it will be appreciated that the oxidation initiation temperature of the second powder 20 of the solder paste 100 according to the first embodiment is at least higher than the eutectic point of the first powder 10 (for example, about 213° C.).

Sn of the first powder 10 may be present in liquid phase during reflow soldering because the oxidation initiation temperature of the second powder 20 is at least higher than the eutectic point of the first powder 10. The liquid-phase Sn prevents reaction of the first powder 10 with oxygen during reflow soldering, and therefore the second powder 20 of the solder paste 100 according to the first embodiment is not substantially oxidized during reflow soldering.

Figure 8A:
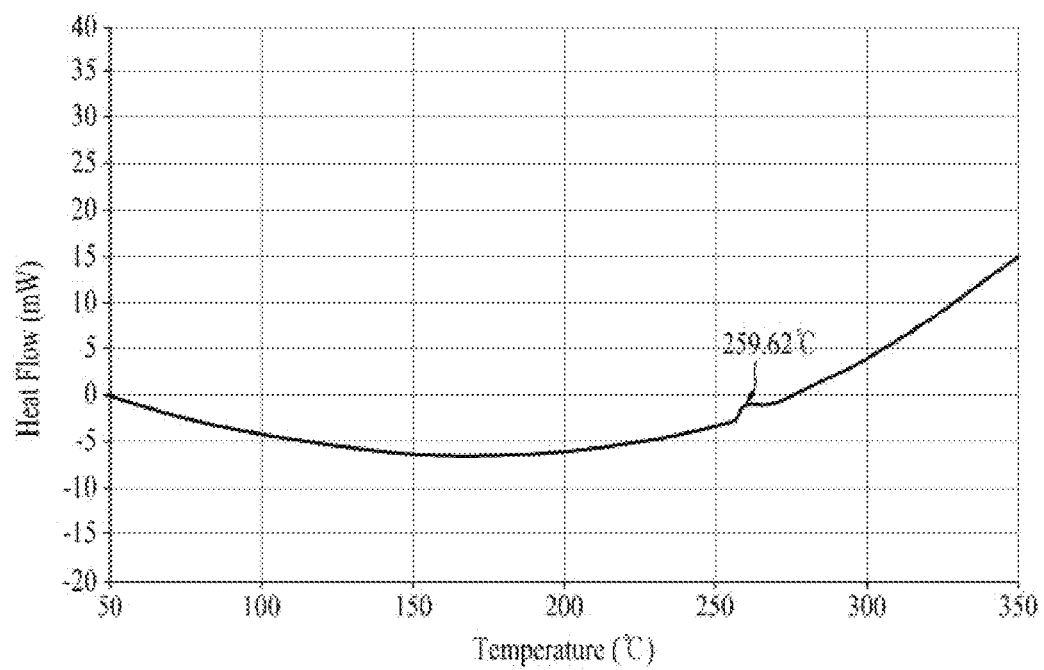
FIG. 8A shows variation of heat flow depending on the temperature of second powder according to a second embodiment.
Figure 8B:
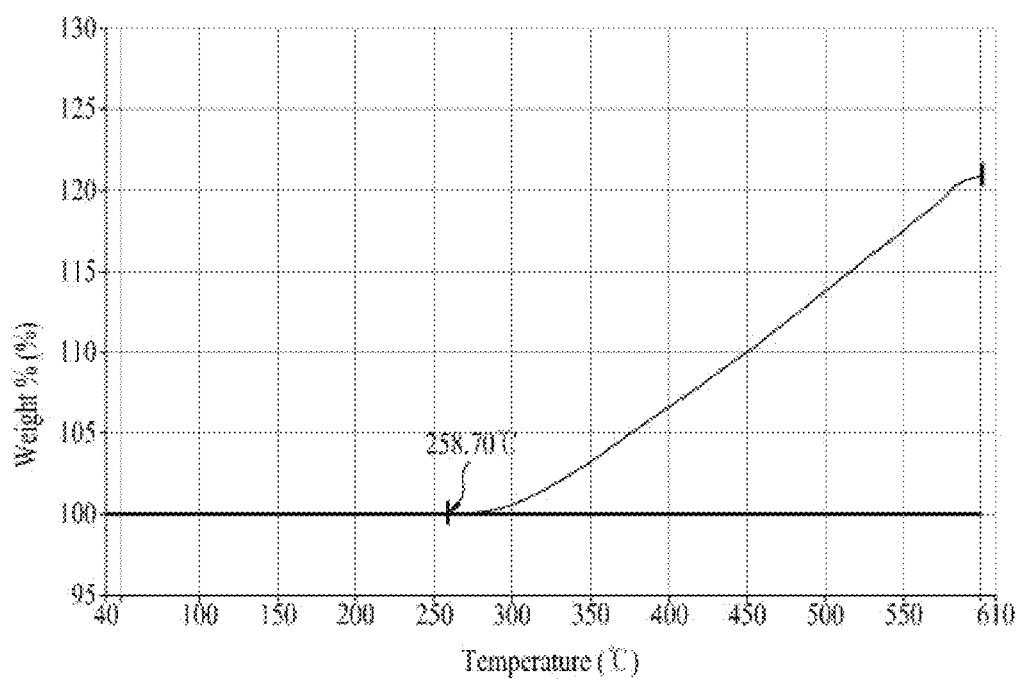
FIG. 8B shows variation of weight depending on the temperature of second powder shown in FIG. 8A.

FIG. 8A shows variation of heat flow depending on the temperature of the second powder 20 according to a second embodiment, and FIG. 8B shows variation of weight depending on the temperature of the second powder 20 shown in FIG. 8A. FIGS. 8A and 8B show a case in which the diameter D1 of the Cu powder 22 is 4 μm, the weight of the second powder 20 is 15% of the weight of the mixed powder 5, and the thickness D2 of the Ag coating film 24 is 0.2 μm.

Referring to FIG. 8A, the oxidation initiation temperature of the second powder 20 may be estimated as about 259.62° C. in consideration of the heat flow of the second powder 20 being rapidly increased from about 259.62° C. Referring to FIG. 8B, the oxidation initiation temperature of the second powder 20 may be estimated as about 258.70° C. in consideration of the weight of the second powder 20 beginning to increase from about 258.70° C.

In consideration of the results of FIGS. 8A and 8B, it will be appreciated that the oxidation initiation temperature of the second powder 20 of the solder paste 100 according to the second embodiment is higher than reflow soldering temperature (for example, 240° C.~250° C.) and thus oxidation of the second powder 20 does not occur at the reflow soldering temperature (for example, 240° C.~250° C.).

Figure 9A:
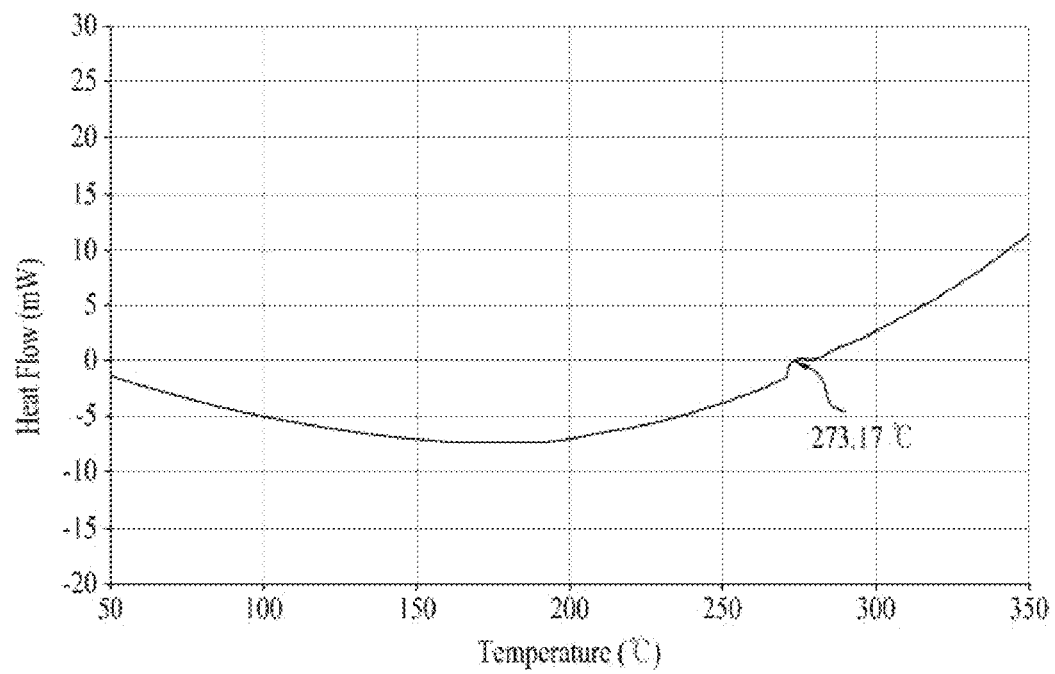
FIG. 9A shows variation of heat flow depending on the temperature of second powder according to a third embodiment.
Figure 9B:
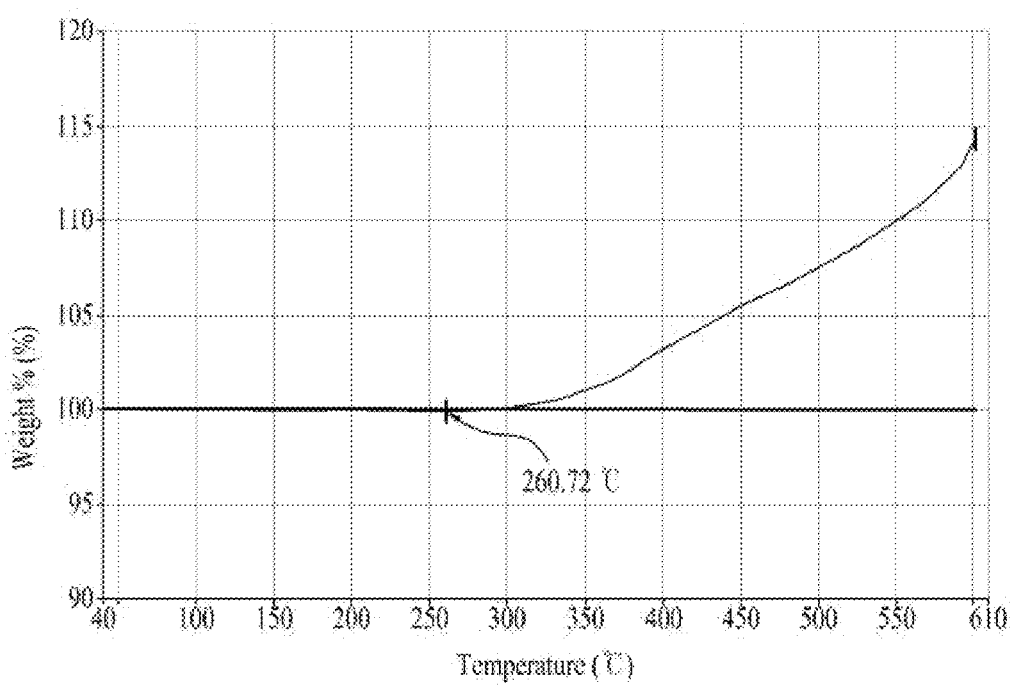
FIG. 9B shows variation of weight depending on the temperature of second powder shown in FIG. 9A.

FIG. 9A shows variation of heat flow depending on the temperature of the second powder 20 according to a third embodiment, and FIG. 9B shows variation of weight depending on the temperature of the second powder 20 shown in FIG. 9A. FIGS. 9A and 9B show a case in which the diameter D1 of the Cu powder 22 is 7 μm, the weight of the second powder 20 is 12% of the weight of the mixed powder 5, and the thickness D2 of the Ag coating film 24 is 0.2 μm.

Referring to FIG. 9A, the oxidation initiation temperature of the second powder 20 may be estimated as about 273.17° C. in consideration of the heat flow of the second powder 20 being rapidly increased from about 273.17° C. Referring to FIG. 9B, the oxidation initiation temperature of the second powder 20 may be estimated as about 260.72° C. in consideration of the weight of the second powder 20 beginning to increase from about 260.72° C.

In consideration of the results of FIGS. 9A and 9B, it will be appreciated that the oxidation initiation temperature of the second powder 20 of the solder paste 100 according to the third embodiment is higher than reflow soldering temperature (for example, 240° C.~250° C.) and thus oxidation of the second powder 20 does not occur at the reflow soldering temperature (for example, 240° C.~250° C.).

Figure 10A:
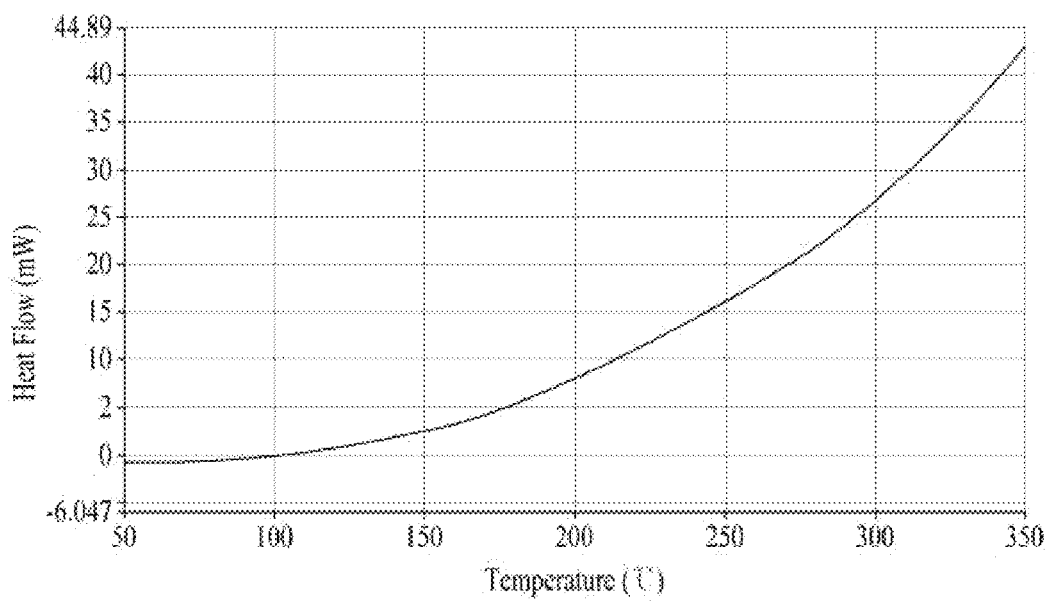
FIG. 10A shows variation of heat flow depending on the temperature of second powder according to a fourth embodiment.
Figure 10B:
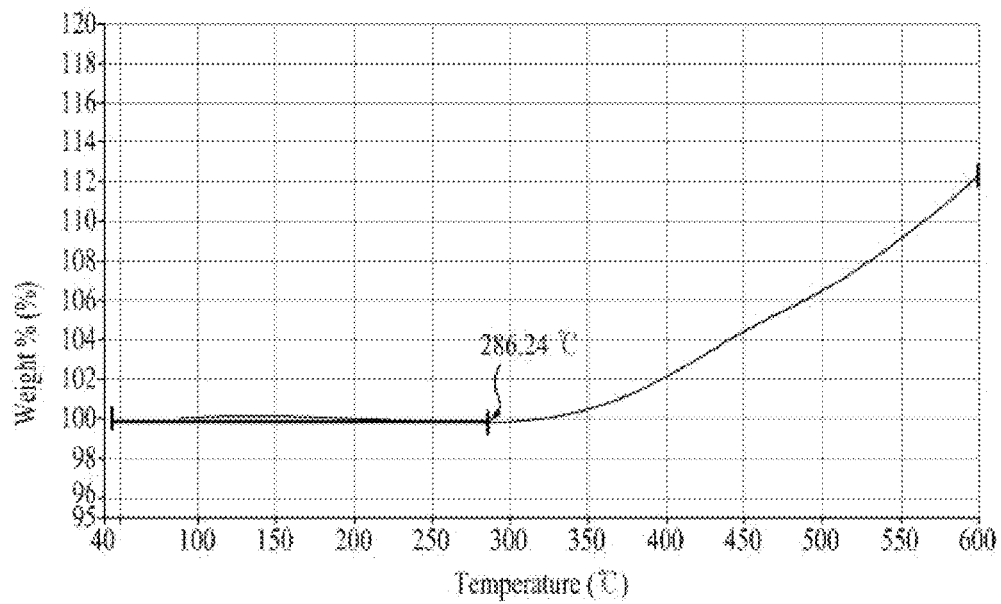
FIG. 10B shows variation of weight depending on the temperature of second powder shown in FIG. 10A.

FIG. 10A shows variation of heat flow depending on the temperature of the second powder 20 according to a fourth embodiment, and FIG. 10B shows variation of weight depending on the temperature of the second powder 20 shown in FIG. 10A. FIGS. 10A and 10B show a case in which the diameter D1 of the Cu powder 22 is 7 μm, the weight of the second powder 20 is 20% of the weight of the mixed powder 5, and the thickness D2 of the Ag coating film 24 is 0.4 μm.

Referring to FIG. 10A, a rapid increase in the heat flow of the second powder 20 is not observed at a temperature of 350° C. or less. Referring to FIG. 10B, the oxidation initiation temperature of the second powder 20 may be estimated as about 286.24° C. in consideration of the weight of the second powder 20 beginning to increase from about 286.24° C.

In consideration of the results of FIGS. 10A and 10B, it will be appreciated that the oxidation initiation temperature of the second powder 20 of the solder paste 100 according to the fourth embodiment is higher than reflow soldering temperature (for example, 240° C.~250° C.) and thus oxidation of the second powder 20 does not occur at the reflow soldering temperature (for example, 240° C.~250° C.).

Figure 11A:
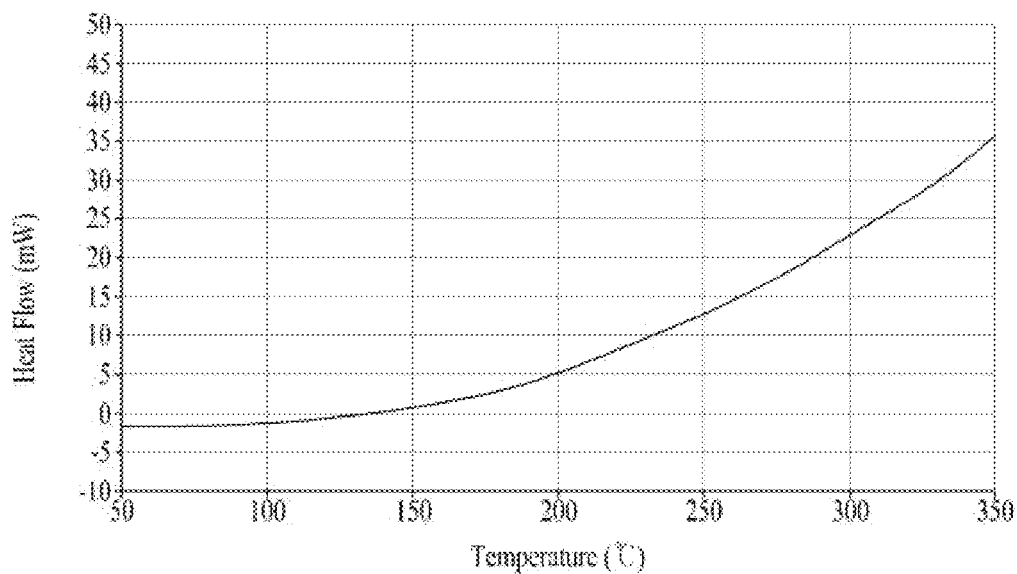
FIG. 11A shows variation of heat flow depending on the temperature of second powder according to a fifth embodiment.
Figure 11B:
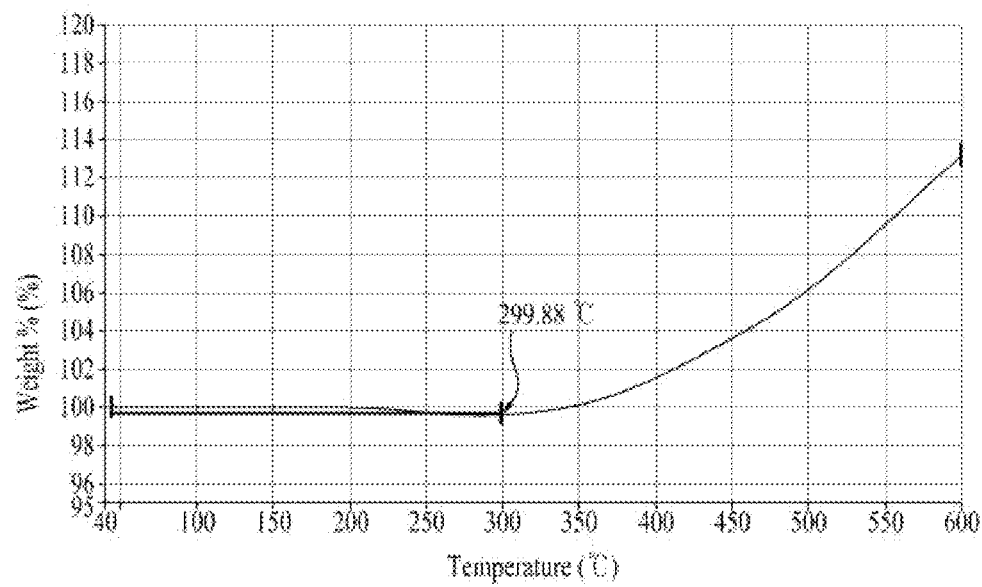
FIG. 11B shows variation of weight depending on the temperature of second powder shown in FIG. 11A.

FIG. 11A shows variation of heat flow depending on the temperature of the second powder 20 according to a fifth embodiment, and FIG. 11B shows variation of weight depending on the temperature of the second powder 20 shown in FIG. 11A. FIGS. 11A and 11B show a case in which the diameter D1 of the Cu powder 22 is 7 μm, the weight of the second powder 20 is 30% of the weight of the mixed powder 5, and the thickness D2 of the Ag coating film 24 is 0.6 μm.

Referring to FIG. 11A, a rapid increase in the heat flow of the second powder 20 is not observed at a temperature of 350° C. or less. Referring to FIG. 11B, the oxidation initiation temperature of the second powder 20 may be estimated as about 299.88° C. in consideration of the weight of the second powder 20 beginning to increase from about 299.88° C.

In consideration of the results of FIGS. 11A and 11B, it will be appreciated that the oxidation initiation temperature of the second powder 20 of the solder paste 100 according to the fifth embodiment is at least higher than reflow soldering temperature (for example, 240° C.~250° C.) and thus oxidation of the second powder 20 does not occur at the reflow soldering temperature (for example, 240° C.~250° C.).

To enhance wettability of a solder, a metal, which may form a barrier coating film, serving to prevent diffusion of Sn of the first powder 10 to the surface of the Cu powder 22 of the second powder 20, must be dissolved in Sn, requires a melting temperature equal to or higher than that of Sn, and must not deteriorate solderability when dissolved in Sn.

A coating film that satisfies the above-described conditions may be formed of Ag as in the embodiment, and nickel (Ni) may satisfy the above-described conditions. However, Ni is well oxidized at a temperature lower than the eutectic point of the first powder 10 (e.g., about 213° C.), numerous voids may be generated in the solder layer after soldering.

That is, since Ni may already be oxidized at a temperature equal to or less than the eutectic point of the first powder 10 (e.g., about 213° C.), an Ni coating film of the second powder 20 may already be oxidized during reflow soldering, and thus numerous voids may be generated in the solder layer after soldering.

Accordingly, when using a barrier coating film formed of Ni, numerous voids generated in the solder layer may increase electric resistance of the solder layer and deteriorate heat radiation, and reflow soldering may thus need to be performed under a nitrogen environment to prevent oxidation.

However, in the embodiment, the barrier coating film may be formed of Ag that is less sensitive to oxidation than Ni. In addition, according to the above-described experimental results, in the embodiment, the oxidation initiation temperature of the second powder 20 may become about 219° C. or more, which is at least higher than the eutectic point of the first powder 10 (e.g., about 213° C.), via adjustment of the weight of the second powder 20 and the thickness of the Ag coating film 24.

As described above, the embodiment may restrict generation of voids in the solder layer and prevent increase in electric resistance and deterioration of heat radiation efficiency caused by voids because substantial oxidation of the second powder 20 does not occur at the reflow soldering temperature (about 240° C.~250° C.).

In addition, the embodiment may not be affected by a nitrogen environment and oxygen density during reflow soldering because substantial oxidation of the second powder 20 does not occur during reflow soldering.

Figure 12A:
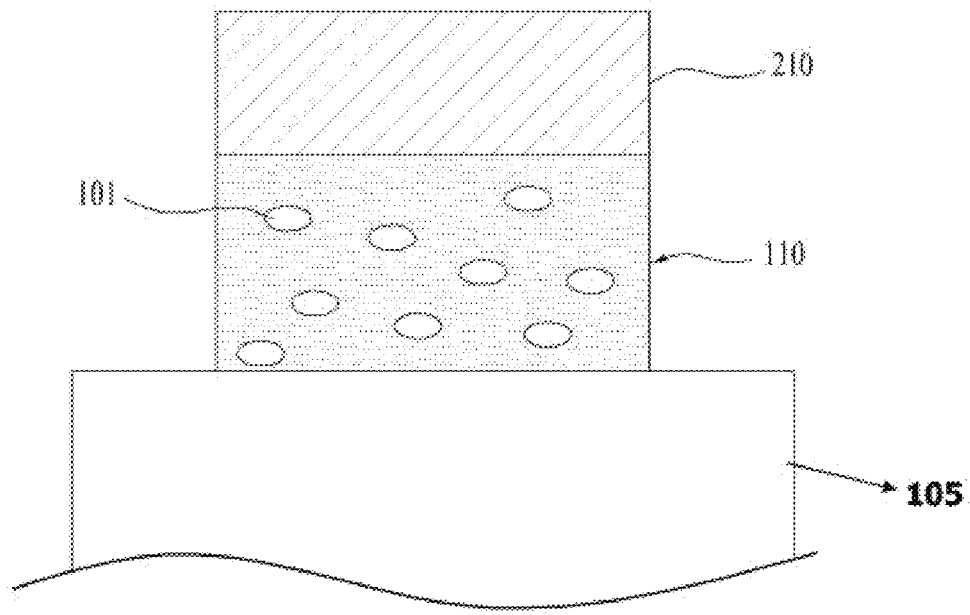
FIG. 12A shows a solder layer using a general solder paste.
Figure 12B:
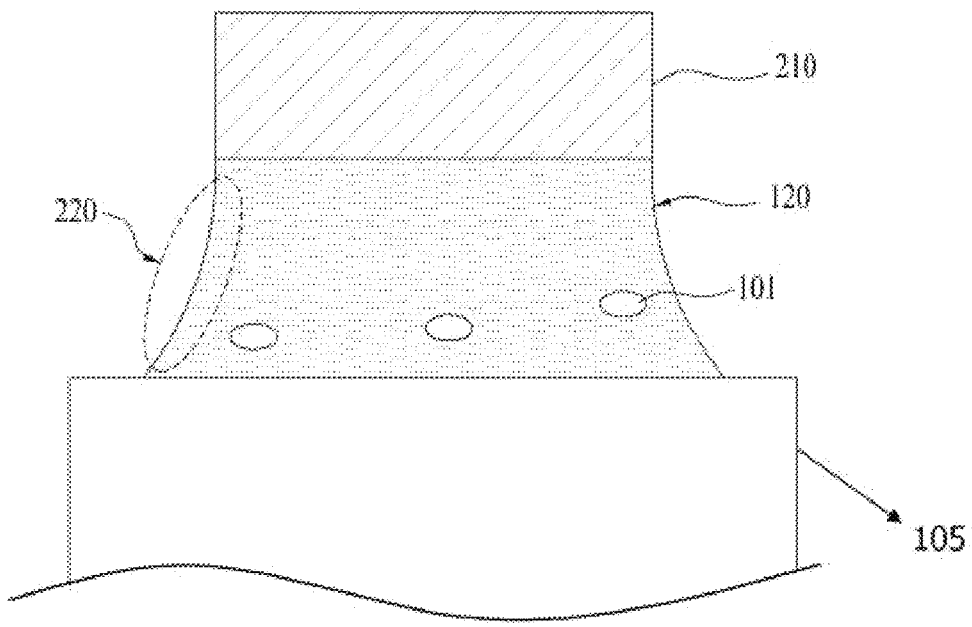
FIG. 12B shows a solder layer using a solder paste according to the embodiment.

FIG. 12A shows a solder layer 110 using a general solder paste, and FIG. 12B shows a solder layer 120 using a solder paste according to the embodiment. It will be appreciated that the solder layer 110, which bonds a base metal 105 and a component 210 as exemplarily shown in FIG. 12A, has numerous voids, whereas the solder layer 120 between the base metal 105 and the component 210 as exemplarily shown in FIG. 12B has good wettability, thus ensuring smooth formation of a fillet 220 at a lateral side thereof and generating fewer voids.

Figure 13:
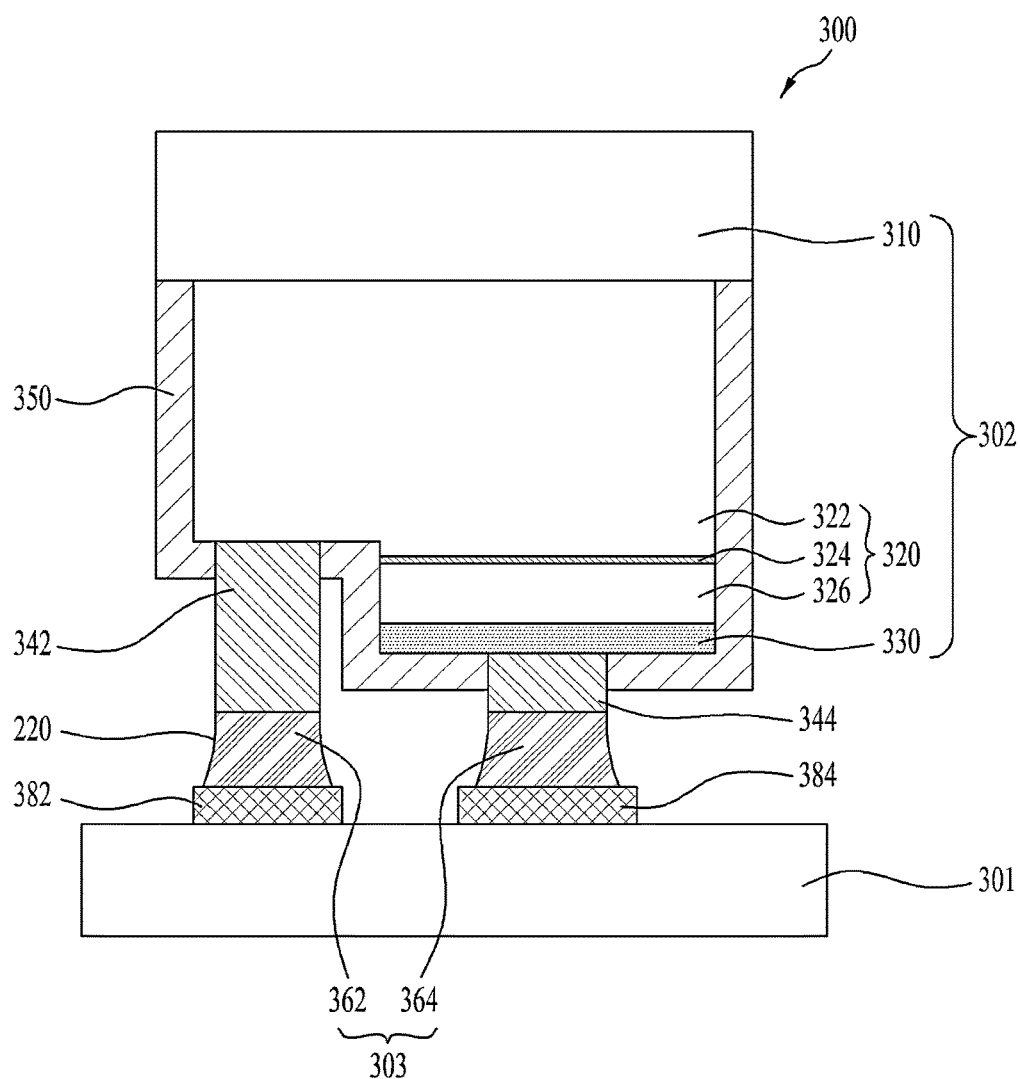
FIG. 13 shows a sectional view of a light emitting device package including a bonding part using the solder paste according to the embodiment.

FIG. 13 shows a sectional view of a light emitting device package 300 including a bonding part 360 using the solder paste according to the embodiment. Referring to FIG. 13, the light emitting device package 300 may include a sub-mount 301, a light emitting device 302, and bonding parts 303.

The sub-mount 301 supports the light emitting device 302, and the light emitting device 302 is mounted on the sub-mount 301. The sub-mount 301 may take the form of a package body or a printed circuit board, for example, and may have various other shapes to allow flip-chip bonding of the light emitting device 302.

The sub-mount 301 may include a first conductive layer 382 and a second conductive layer 384, which are bonded to the light emitting device 302. The first conductive layer 382 and the second conductive layer 384 may be spaced apart from each other so as to be electrically isolated from each other.

The light emitting device 302 is disposed on the sub-mount 301, and is electrically connected to the sub-mount 301 via the bonding parts 303. The light emitting device 302 includes a substrate 310, a light emitting structure 320, a conductive layer 330, a first electrode 342, a second electrode 344, and an insulation layer 350. The light emitting device 302 may be disposed on the sub-mount 301 such that the first electrode 342 and the second electrode 344 face the sub-mount 301. The light emitting structure 320 is located on one surface of the substrate 310.

The substrate 310 may be a light transmitting substrate, such as, for example, any one of a sapphire substrate, a silicone (Si) substrate, a zinc oxide (ZnO) substrate, and a nitride semiconductor substrate, or may be a template substrate on which at least one of GaN, InGaN, AlGaN, AlInGaN, SiC, GaP, InP, $Ga_2O_3$, and GaAs is stacked.

The light emitting structure 320 may include multiple group III-V compound semiconductor layers. For example, the light emitting structure 320 may include a first conductive semiconductor layer 322, a second conductive semiconductor layer 326, and an active layer 324 between the first conductive semiconductor layer 322 and the second conductive semiconductor layer 326.

A side surface of the light emitting structure 320 may be inclined by isolation etching for division on a per unit chip basis. For example, the side surface of the light emitting structure 320 may have an inclination from a surface of the substrate 310.

The first conductive semiconductor layer 322 may be formed of group III-V compound semiconductors and may be doped with a first conductive dopant. The first conductive semiconductor layer 322 may be formed of a semiconductor material having a composition equation of $In_xAl_yGa_{1-x-y}N$ ($0 \le x \le 1$, $0 \le y \le 1$, $0 \le x+y \le 1$), and for example, may be selected from among AlGaN, GaN, AlN, InGaN, InA, InAlGaN, AlInN, AlGaAs, GaP, GaAs, GaAsP, AlGaInP, and the like, and may be doped with an n-type dopant, such as Si, Ge, Sn, Te, or the like.

The active layer 324 may generate light using energy generated during recombination of electrons and holes provided from the second conductive semiconductor layer 326 and the first conductive semiconductor layer 322. The active layer 324 may be formed of a semiconductor material having a composition equation of $In_xAl_yGa_{1-x-y}N$ ($0 \le x \le 1$, $0 \le y \le 1$, $0 \le x+y \le 1$). The active layer 324 may have any one of a single quantum well structure, a multi quantum well structure, a quantum-dot structure, or a quantum-wire structure.

In a case in which the active layer 324 has a multi quantum well structure, the active layer 324 may take the form of a stack of multiple well layers and multiple barrier layers. For example, the well layer/barrier layer of the active layer 324 may have at least one pair configuration of InGaN/GaN, InGaN/InGaN, GaN/AlGaN, InAlGaN/GaN, GaAs(InGaAs)/AlGaAs, and GaP(InGaP)/AlGaP, without being limited thereto. In this case, the well layer may be formed of a material having a smaller energy band gap than that of the barrier layer.

The second conductive semiconductor layer 326 may be formed of group III-V compound semiconductors and may be doped with a second conductive dopant. The second conductive semiconductor layer 326 may be formed of a semiconductor material having a composition equation of $In_xAl_yGa_{1-x-y}N$ ($0 \leq x \leq 1$, $0 \leq y \leq 1$, $0 \leq x+y \leq 1$), and for example, may be selected from among AlGaN, GaN, AlN, InGaN, InA, InAlGaN, AlInN, AlGaAs, GaP, GaAs, GaAsP, AlGaInP, and the like, and may be doped with a p-type dopant, such as Mg, Zn, Ca, Sr, Ba, or the like.

A clad layer (not shown) doped with an n-type or p-type dopant may be formed between the active layer 324 and the first conductive semiconductor layer 322, or between the active layer 324 and the second conductive semiconductor layer 326. The clad layer may be a semiconductor layer including AlGaN or InAlGaN.

Although the above description illustrates that the first conductive semiconductor layer 322 includes an n-type semiconductor layer and the second conductive semiconductor layer 326 includes a p-type semiconductor layer, the embodiment is not limited thereto. The first conductive semiconductor layer 322 may include a p-type semiconductor layer and the second conductive semiconductor layer 326 may include an n-type semiconductor layer. In addition, an n-type or p-type semiconductor layer may further be provided under the second conductive semiconductor layer 326.

Accordingly, the light emitting structure 320 may include at least one of nn, pn, npn, and pnp bonding configurations. In addition, the dopants of the first conductive semiconductor layer 322 and the second conductive semiconductor layer 326 may have an even or uneven doping density. That is, the configuration of the light emitting structure 320 may be altered in various ways, and the light emitting structure 320 may emit light having various wavelengths.

The conductive layer 330 may be disposed on the second conductive semiconductor layer 326. For example, the conductive layer 330 may be located between the second conductive semiconductor layer 326 and the second electrode 344, and may be in ohmic contact with respect to the second conductive semiconductor layer 326. The conductive layer 330 may reduce total reflection and exhibit high light transmittance, thus increasing extraction efficiency of light from the active layer 324 to the second conductive semiconductor layer 326.

The conductive layer 330 may be formed of at least one of a metal in ohmic contact with the second conductive semiconductor layer 326, for example, at least one of Au, Pd, Pt, Ru, Re, Mg, Zn, Hf, Ta, Rh, Ir, W, Ti, Ag, Cr, Mo, Nb, Al, Ni, Cu, WTi, V, or alloys thereof. In addition, the conductive layer 330 may be formed in a single layer or in multiple layers using a transparent oxide-based material exhibiting high transmittance at wavelengths of emitted light, for example, one or more of Indium Tin Oxide (ITO), Tin Oxide (TO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni, Ag, Ni/IrOx/Au, or Ni/IrOx/Au/ITO.

The light emitting structure 320 may have a region, through which a portion of the first conductive semiconductor layer 322 is exposed for arrangement of the first electrode 342. For example, the light emitting structure 320 may include a region formed by partially etching the second conductive semiconductor layer 326, the active layer 324, and the first conductive semiconductor layer 322 so as to expose a portion of the first conductive semiconductor layer 322.

The first electrode 342 may be disposed on the exposed portion of the first conductive semiconductor layer 322 to come into contact with the first conductive semiconductor layer 322. The second electrode 344 may be disposed on an upper surface of the conductive layer 330 to come into contact with the conductive layer 330. The first electrode 342 and the second electrode 344 may be formed of a conductive metal, for example, at least one of Au, Pd, Pt, Ru, Re, Mg, Zn, Hf, Ta, Rh, Ir, W, Ti, Ag, Cr, Mo, Nb, Al, Ni, Cu, WTi, V, or alloys thereof.

The insulation layer 350 may be disposed on a side surface of the light emitting structure 320. For example, the insulation layer 350 may cover the side surface of the light emitting structure 320. In addition, the insulation layer 350 may be disposed on the exposed remaining portion of the first conductive semiconductor layer 322 except for the portion where the first electrode 342 is disposed.

In addition, the insulation layer 350 may be disposed on the exposed portion of the upper surface of the conductive layer 330 except for the portion where the second electrode 344 is disposed. The insulation layer 350 may exposed at least a portion of the upper surface of the first electrode 342 and at least a portion of the upper surface of the second electrode 344.

The sub-mount 301 is located below the first electrode 342 and the second electrode 344. The sub mount 310 may include, for example, a printed circuit board formed of a resin, such as PolyPhthal Amide (PPA), Liquid Crystal Polymer (LCP), PolyAmide9T (PA9T), and the like, a metal, photosensitive glass, sapphire, ceramic, and the like. However, the sub-mount 301 according to the embodiment is not limited to the above materials.

The first conductive layer 382 and the second conductive layer 384 may be disposed on the upper surface of the sub-mount 301 so as to be spaced apart from each other. Here, the upper surface of the sub-mount 301 may be a surface facing the light emitting device 302.

The first conductive layer 382 and the first electrode 342 may be vertically aligned with each other, and the second conductive layer 384 and the second electrode 344 may be vertically aligned with each other. Here, a vertical direction may be an alignment direction of the sub-mount 301 and the light emitting device 302.

The bonding parts 303 may be located between the first conductive layer 382 and the first electrode 342 and between the second conductive layer 384 and the second electrode 344 to bond the same to each other. For example, the bonding parts 303 may include a first bonding part 362 bonding the first conductive layer 382 and the first electrode 342 to each other, and a second bonding part 364 bonding the second conductive layer 384 and the second electrode 344 to each other.

The first bonding part 362 and the second bonding part 364 may be solder using the solder paste 100 according to the embodiment. The first bonding part 362 and the second bonding part 364 may have the fillet 220 described in FIG. 12B. That is, the light emitting device 302 may be flip-chip bonded to the sub-mount 301 using the solder paste 100 according to the embodiment.

As is apparent from the above description, the embodiments may provide enhanced wettability and restricted void generation.

Embodiments provide a solder paste that may enhance wettability and restrict void generation.

In one embodiment, a solder paste comprises a flux, and a mixed powder mixed with the flux, the mixed powder includes first powder and second powder mixed with each other, the first powder includes tin and at least one metal dissolved in the tin, and the second powder includes copper powder, the surface of which is coated with silver.

The at least one metal may include copper and silver.

The first powder may include an alloy of tin, silver, and copper.

The weight of the second powder may be in a range of 5% to 40% of the weight of the mixed powder.

The weight of silver coating included in the second powder may be in a range of 10% to 50% of the weight of copper powder included in the second powder.

The diameter of the copper powder included in the second powder may be in a range of 2 μm to 25 μm.

The thickness of silver coating included in the second powder may be 1 μm or less.

The at least one metal may include at least one of silver (Ag), copper (Cu), antimony (Sb), bismuth (Bi), indium (In), and zinc (Zn).

A ratio of the weight percentage of tin to silver to copper included in the first powder may be 96.5:3:0.5.

The first powder may be formed by breaking an alloy lump of tin, silver, and copper.

An oxidation initiation temperature of the second powder may be 219° C. or more.

An oxidation initiation temperature of the second powder may be higher than a range of 240° C. to 250° C.

The flux may be liquid-phase, a solid having ductility, or a solid.

The flux may include rosin, a thinner, and an activator.

The activator may be present in an amount of 30% to 70% based on the total weight of the flux.

The flux may further include a gelant, and the gelant may present in an amount of 0.1% to 10% based on the total weight of the flux.

The activator may further include a halogenated compound.

The diameter of the copper powder may be in a range of 4 μm to 7 μm.

In another embodiment, a solder paste comprises a flux, and a mixed powder mixed with the flux, the mixed powder including first powder and second powder mixed with each other, wherein the first powder includes tin and at least one metal dissolved in the tin, and the second powder includes copper powder and a barrier coating film coated on the surface of the copper powder, and wherein the melting temperature of the barrier coating film is equal to or higher than that of the tin.

The barrier coating film may be a silver coating film.

An oxidation initiation temperature of the second powder may be higher than the eutectic point of the first powder.

In another embodiment, a solder paste comprises a flux, and a mixed powder mixed with the flux, the powder including first powder and second powder mixed with each other, wherein the first powder includes tin, silver, and copper, wherein the second powder includes copper powder and a silver coating film over the entire surface of the copper powder, wherein the weight of the second powder is in a range of 5% to 40% of the weight of the mixed powder, and wherein the weight of the silver coating film included in the second powder is in a range of 10% to 50% of the weight of the copper powder included in the second powder.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solder paste comprising:
   a flux including rosin, a thinner and an activator; and
   a mixed powder mixed with the flux, the mixed powder including first powder and second powder mixed with each other,
   wherein the first powder includes tin and at least one metal dissolved in the tin, and the second powder includes a copper powder, and an Ag coating film formed on a surface of the copper powder,
   wherein a diameter of the copper powder included in the second powder is in a range of 4 μm to 7 μm and a thickness of the Ag coating film is 1 μm or less, and
   wherein the activator is present in an amount of 40% to 60% based on the total weight of the flux.

2. The solder paste according to claim 1, wherein the at least one metal includes copper and silver.

3. The solder paste according to claim 1, wherein the first powder includes an alloy of tin, silver, and copper.

4. The solder paste according to claim 1, wherein the weight of the second powder is in a range of 5% to 40% of the weight of the mixed powder.

5. The solder paste according to claim 1, wherein the weight of the Ag coating film included in the second powder is in a range of 10% to 50% of the weight of copper powder included in the second powder.

6. The solder paste according to claim 1, wherein a diameter of the copper powder is 4 μm, the weight of the second powder is 10% of the weight of the mixed powder and the thickness of the Ag coating film is 0.1 μm.

7. The solder paste according to claim 1, wherein a diameter of the cooper powder is 4 μm, the weight of the second powder is 15% of the weight of the mixed powder, and the thickness of Ag coating film is 0.2 μm.

8. The solder paste according to claim 1, wherein the at least one metal includes at least one of silver (Ag), copper (Cu), antimony (Sb), bismuth (Bi), indium (In), and zinc (Zn).

9. The solder paste according to claim 3, wherein a ratio of the weight percentage of tin to silver to copper included in the first powder is 96.5:3:0.5.

10. The solder paste according to claim 3, wherein the first powder is formed by breaking an alloy lump of tin, silver, and copper.

11. The solder paste according to claim 1, wherein an oxidation initiation temperature of the second powder is 219° C. or more.

12. The solder paste according to claim 1, wherein an oxidation initiation temperature of the second powder is higher than a range of 240° C. to 250° C.

13. The solder paste according to claim 1, wherein the flux is liquid-phase, a solid having ductility, or a solid.

14. The solder paste according to claim 13, wherein a diameter of the copper powder is 7 µm, the weight of the second powder is 12% of the weight of the mixed powder, and the thickness of Ag coating film is 0.2 µm.

15. The solder paste according to claim 1, wherein a diameter of the copper powder is 7 µm, the weight of the second powder is 20% of the weight of the mixed powder, and the thickness of Ag coating film is 0.4 µm.

16. The solder paste according to claim 1, wherein the flux further includes a gelant, and
the gelant is present in an amount of 0.1% to 10% based on the total weight of the flux.

17. A solder paste comprising:
a flux including rosin, a thinner, and an activator, and
a mixed powder mixed with the flux, the mixed powder including first powder and second powder mixed with each other,
wherein the first powder includes tin and at least one metal dissolved in the tin, and the second powder includes copper powder and a barrier coating film coated on the surface of the copper powder, and
wherein the melting temperature of the barrier coating film is equal to or higher than that of the tin,
wherein a diameter of the copper powder included in the second powder is in a range of 4 µm to 7 µm and a thickness of the barrier coating film is 1 µm or less, and
wherein the activator is present in an amount of 40% to 60% based on the total weight of the flux.

18. The solder paste according to claim 17, wherein the barrier coating film is a silver coating film.

19. The solder paste according to claim 17, wherein an oxidation initiation temperature of the second powder is higher than the eutectic point of the first powder.

20. A solder paste comprising:
a flux inducing rosin, a thinner, and an activator; and
a mixed powder mixed with the flux, the mixed powder including first powder and second powder mixed with each other,
wherein the first powder includes tin, silver, and copper,
wherein the second powder includes copper powder and a silver coating film over the entire surface of the copper powder,
wherein the weight of the second powder is in a range of 5% to 40% of the weight of the mixed powder, and
wherein the weight of the silver coating film included in the second powder is in a range of 10% to 50% of the weight of the copper powder included in the second powder,
wherein a diameter of the copper powder included in the second powder is in a range of 4 µm to 7 µm and a thickness of the silver coating film is 1 µm or less, and
wherein the activator is present in an amount of 40% to 60% based on the total weight of the flux.

* * * * *